United States Patent [19]

Pierce et al.

[11] Patent Number: 5,033,048
[45] Date of Patent: Jul. 16, 1991

[54] MEMORY SELFTEST METHOD AND APPARATUS SAME

[75] Inventors: Donald C. Pierce, Fitchburg; Edward H. Utzig, Shrewsbury; Robert N. Crouse, Brighton; Noreen Hession, South Braintree; Donald W. Smelser, Bolton; Hansel A. Collins, Clinton, all of Mass.

[73] Assignee: Digital Equipment Corporation, Maynard, Mass.

[21] Appl. No.: 525,203

[22] Filed: Apr. 19, 1990

Related U.S. Application Data

[63] Continuation of Ser. No. 176,699, Apr. 1, 1988, abandoned.

[51] Int. Cl.$^5$ .............................................. G06F 11/00
[52] U.S. Cl. ...................................... 371/21.2; 271/27; 364/717
[58] Field of Search .................. 371/21.1, 21.2, 21.3, 371/25.1, 13, 27; 365/201; 364/717; 324/73.1

[56] References Cited

U.S. PATENT DOCUMENTS

| | | | |
|---|---|---|---|
| 4,293,950 | 10/1981 | Shimizu et al. | 371/21 |
| 4,369,511 | 1/1983 | Kimura | 371/21 |
| 4,672,610 | 6/1987 | Salick | 371/21 X |
| 4,713,605 | 12/1987 | Iyer | 371/25 X |
| 4,715,034 | 12/1987 | Jacobson | 371/25 X |
| 4,780,627 | 10/1988 | Illman | 371/25 X |
| 4,782,487 | 11/1988 | Smelser | 371/27 X |

OTHER PUBLICATIONS

Daehn, "A Test Generator IC for Testing Large CMOS-RAMs" (Sep. 1986) IEEE, pp. 18-24.
Sun et al., "Self-Testing of Embedded RAMs", (Oct. 1984) IEEE, pp. 148-156.
IBM Technical Disclosure Bulletin, (Aug. 1982) pp. 1216-1227.

Primary Examiner—Jerry Smith
Assistant Examiner—Robert W. Beausoliel
Attorney, Agent, or Firm—Fish & Richardson

[57] ABSTRACT

A method and apparatus for testing each memory location of a memory device, the method comprising the steps of: generating each of the memory addresses corresponding to each memory location in a pseudo-random order; generating a pseudo-random series of data words; storing one of the data words at each memory location; reading each data word back from memory; regenerating the series of data words; and comparing each read data word to the corresponding regenerated data word. The invention features generating and storing a second series of data words, each data word being inverse of the data words in the first series. The second series of data words are read from memory and compared to regenerated data. The invention also features a novel linear feedback shift register for generating the pseudo-random memory addresses and can generate the address zero. An accumulating register is utilized to store the approximate location of malfunctioning memory locations.

26 Claims, 12 Drawing Sheets

MEMORY SELFTEST METHOD AND APPARATUS SAME

This is a continuation of copending application Ser. No. 07,176,699 filed on 4/1/88, now abandoned.

BACKGROUND OF THE INVENTION

This invention relates to an apparatus and method for testing the memory locations of a memory device. This application is related to U.S. Pat. No. 4,782,487, issued Nov. 1, 1988, entitled "Memory Test Method and Apparatus" and assigned to the same assignee as the present application.

In order to insure that data is accurately stored and retrieved, it is essential that all of the memory locations of a memory device are operating properly. In other words, it is essential that a data word written into a location be accurately read from that location when it is needed. However, memory locations will occasionally malfunction and a data word read from such a malfunctioning location may not match the data word that was written into the location. In order to avoid using data that has been unintentionally altered in this way, it is desirable to identify "bad" memory locations before they are used such that the bad memory can be repaired or replaced.

There are a number of known schemes for testing computer memories. One prior art method is to write all binary ones or zeros into a memory and then to read from the memory, checking for errors.

Another prior art method is to remain at each memory address long enough to write and read a series of data words at that address, wherein each data word comprises zeros and a single one, and the data words differ in the position of that single one bit. The one bit "walks" through each bit position as the data words are written into and read from the memory.

Some prior art memory testers use a simple increment-by-one counter to generate memory addresses, and some prior art memory testers employ more than one address counter to generate addresses while testing is done.

Another prior art method of memory testing, known as the Galpat test, involves staying at one address while changing data patterns that are written into and read from that address, and then moving on to and doing the same at other addresses. The amount of time it takes to run a Galpat test on a memory is generally proportional to the square of the number of memory addresses tested.

One prior art way to check data for errors is to check parity. Various prior art error detecting and correcting codes can be employed, including the Hamming code. The Hamming code offers the ability to detect errors involving two bits and detect and correct errors involving a single bit.

SUMMARY OF THE INVENTION

In general, the invention features a method and apparatus for testing each memory location of a memory. In the preferred embodiment, the method includes the steps of: generating each of the memory addresses corresponding to each memory location in a predetermined order; generating a predetermined series of data words; storing one of the data words at each location in the memory; reading each data word back from memory; regenerating the predetermined series of data words; comparing the words read back from memory with the regenerated data words; and indicating an error when the read data word does not equal the regenerated data word.

In order to further increase the accuracy of the memory test method of the invention, the memory is written with a second predetermined series of data words, with each data word in this second series being inverse to the corresponding data word in the first series of data words. Additionally, the memory addresses are generated in a pseudo-random order and the predetermined series of data words is a pseudo-random series.

The invention features a novel linear feedback shift register used to generate the pseudo random memory addresses and is able to generate the address zero.

An accumulating register is used to store approximate locations of bad sections of memory in order to facilitate diagnostic service on the memory system.

DESCRIPTION OF THE PREFERRED EMBODIMENTS

The drawings will first briefly be described.

DRAWINGS

FIG. a block diagram of a computer system utilizing the selftest feature of the present invention.

FIGS. 6-1 and 6-2 are a flowchart illustrating the selftest method of a first embodiment of the invention.

FIGS. 9-1, 9-2, 9-3 and 9-4 are a flowchart illlustrating the selftest method in accordance with a second embodiment of the invention.

STRUCTURE

Figure 1:
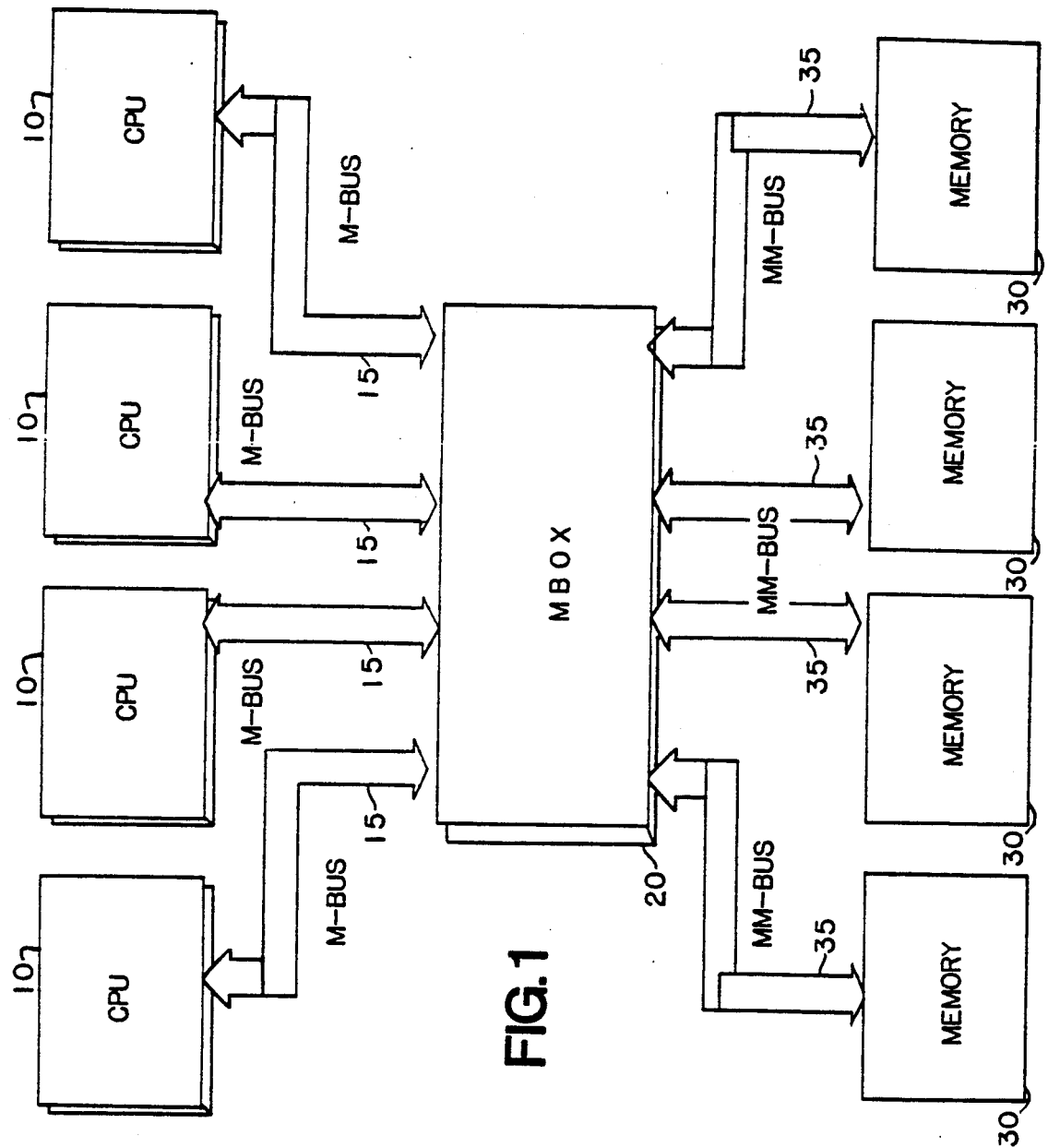

An overall block diagram of a computer system employing the present invention is shown in FIG. 1 and includes four central processing units or CPUs 10, which are each connected to MBOX 20 over an MBUS 15. Also connected to MBOX 20 are four memories 30, each of which is connected via an MMBUS 35.

Figure 2:
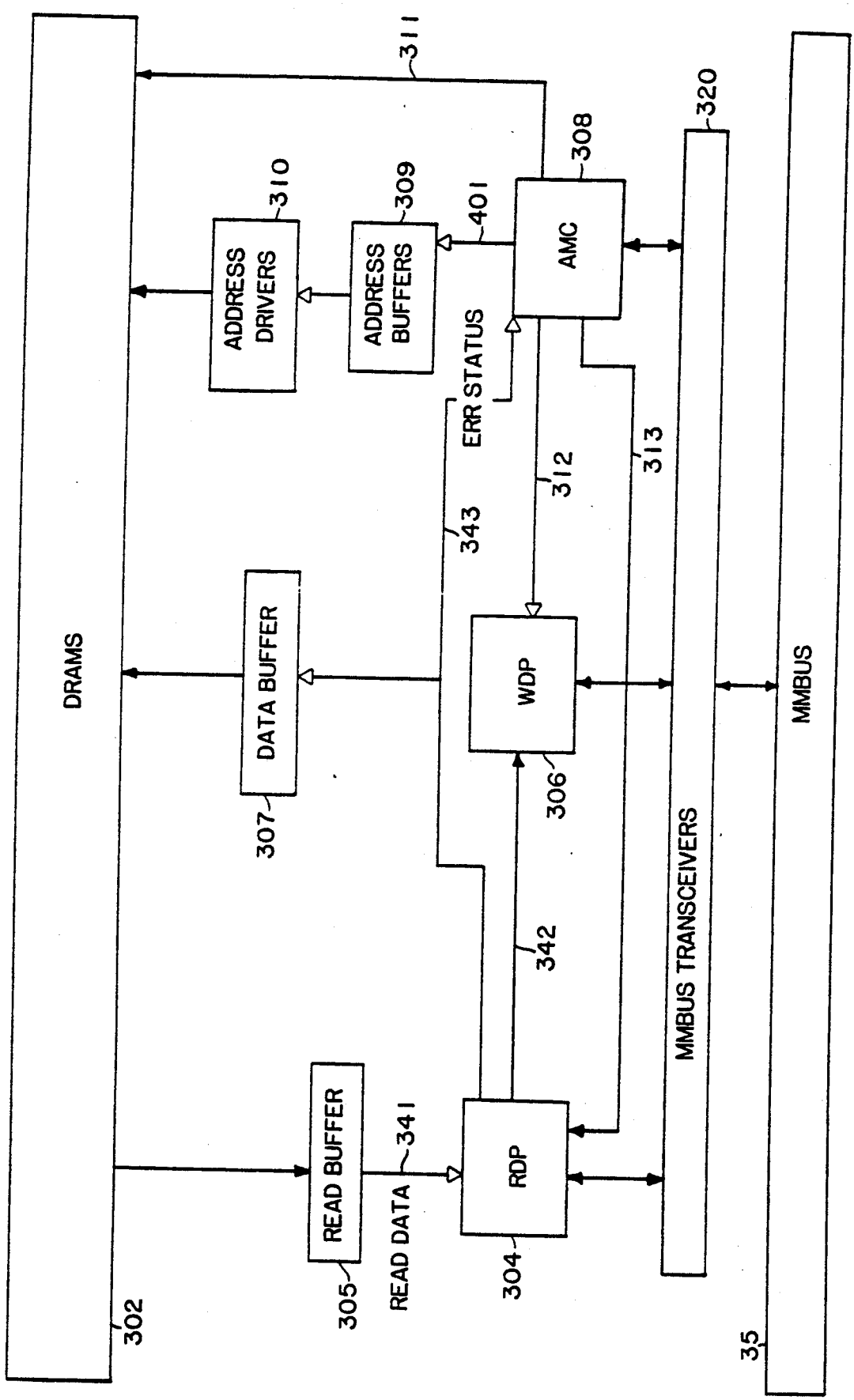
FIG. 2 is a block diagram of a memory device shown in FIG. 1.

FIG. 2 is a more detailed block diagram of a memory 30 and comprises DRAMS 302, read data path chip (RDP) 304, write data path chip (WDP) 306, and address and module control chip (AMC) 308. The three chips are connected to MMBUS 35 via MMBUS transceivers 320. RDP 304 receives data from DRAMS 302 through read buffer 305. WDP 306 is connected to DRAMS 302 through data buffer 307, and AMC 308 through address buffers 309 and address drivers 310. AMC 308 is also connected to DRAMS 302 via control line 311 which supplies standard controls to DRAMS 302 such as row address strobe and column address strobe. AMC 308 also provides control line 312 to WDP 306 and control line 313 to RDP 304. RDP 304 provides error status line 343 to AMC 308 and line 342 to WDP 306.

Figure 3:
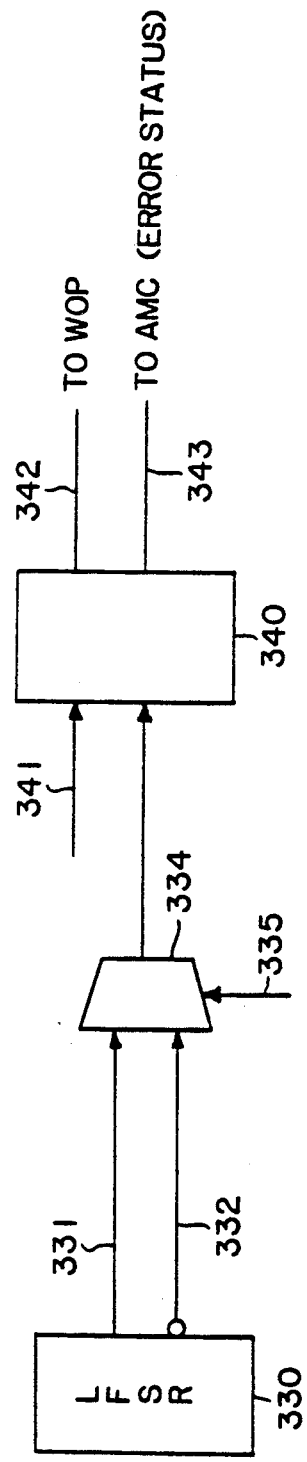
FIGS. 3-4 are block diagrams of portions of the memory device shown in FIG. 2.

A portion of RDP 304 is shown in greater detail in FIG. 3 and includes linear feedback shift register (LFSR) 330 having output line 331 and inverse output line 332. Output lines 331 and 332 are input to selector 334 having control line 335. The output of selector 334 is input to compare circuit 340. Compare circuit 340 receives raw data from read buffer 305 (see FIG. 2) over line 341 and has output 342 to WDP 306 and output 343 to AMC 308.

Figure 4:
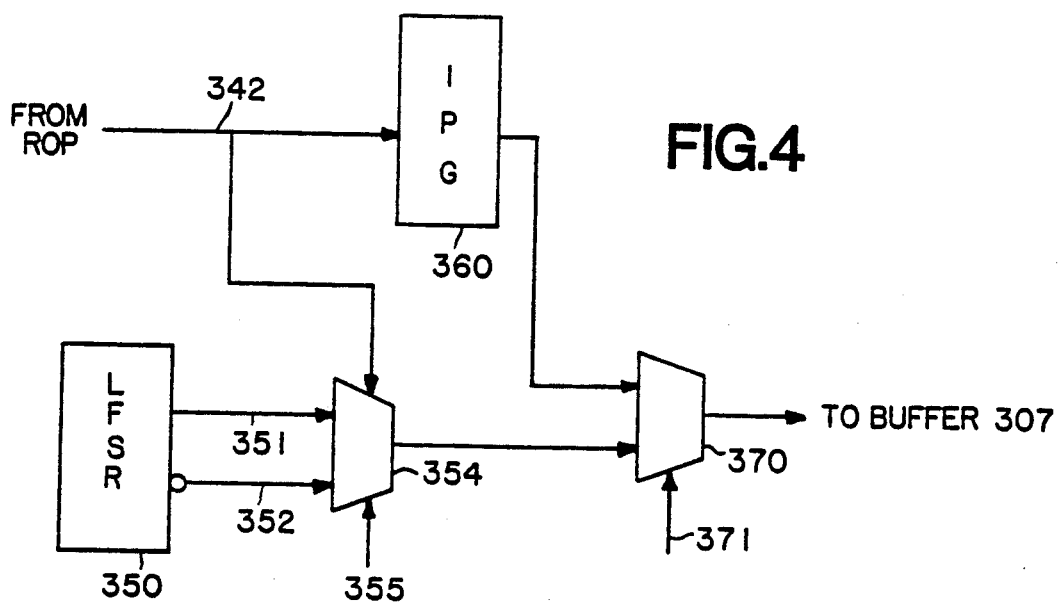

A portion of WDP 306 is shown in greater detail in FIG. 4 and comprises linear feedback shift register (LFSR) 350 (identical to LFSR 330) with output 351 and inverse output 352. Outputs 351 and 352 are connected to selector 354 which receives an input from RDP 304 via line 342 and which has control line 355. WDP 306 also includes initiation pattern generator (IPG) 360 which also receives input line 342 from RDP 304. The outputs of selector 354 and IPG 360 are input to selector 370 which receives control line 371, the output of which is connected to data buffer 307.

Figure 5:
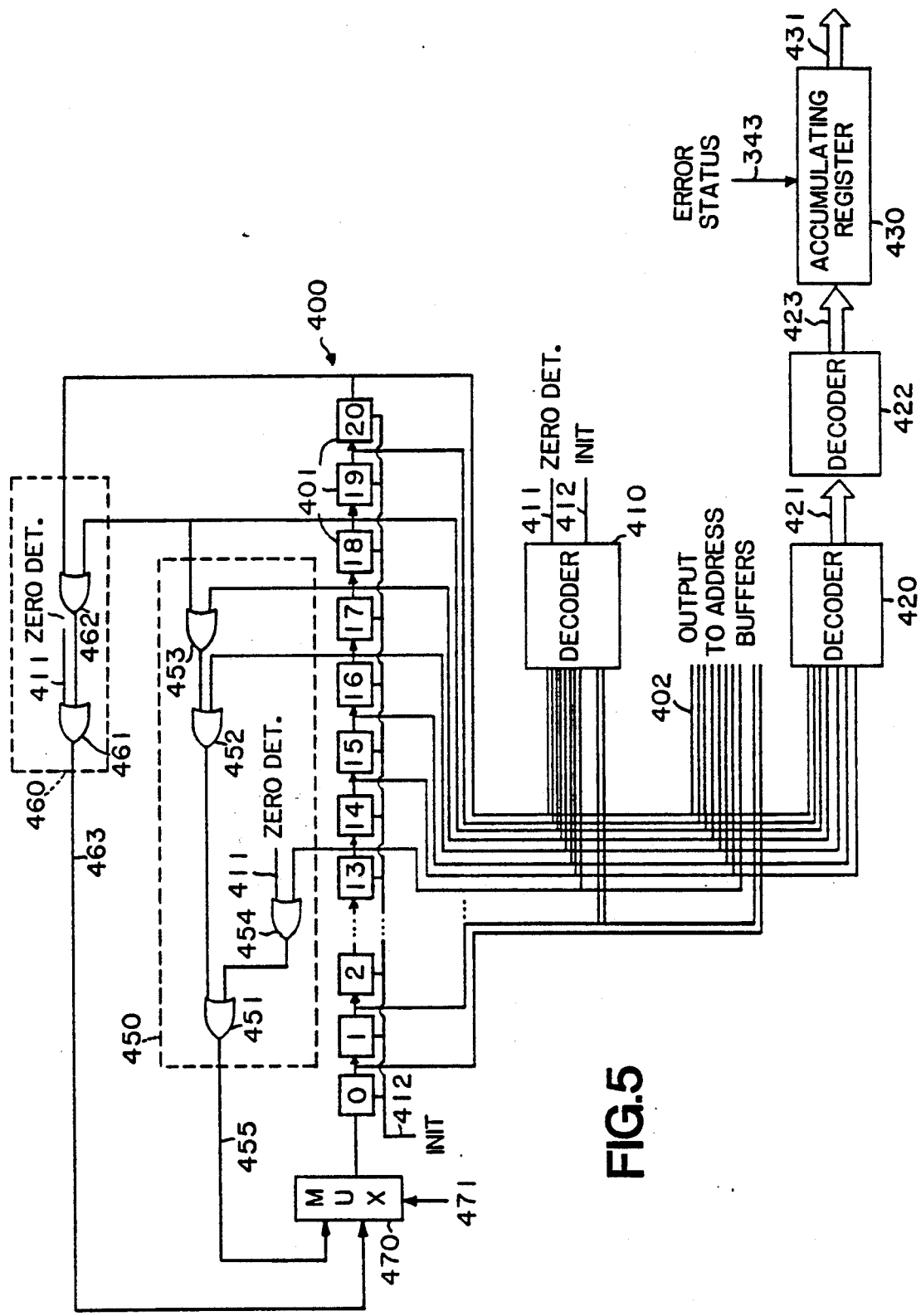
FIG. 5 is a schematic diagram of a control chip shown in FIG. 2.

FIG. 5 illustrates a portion of AMC 308 in greater detail and includes a linear feedback shift register 400 which comprises a series of stages 401 (numbered 0–20). Each stage has an associated output line each of which is connected to output 402, and decoder 410. Additionally, the outputs of stages 14–20 are connected to decoder 420. The outputs from stages 13, 16, 17 and 18 are connected to first feedback network 450 while the outputs from stages 18 and 20 are connected to second feedback network 460. Feedback network 450 comprises OR gates 451-454 and has output 455 connected to MUX 470. Similarly, feedback network 460 comprises OR gates 461 and 462, and has output 463 connected to MUX 470. MUX 470 has control line 471.

Decoder 410 has output 411 which detects when each of the registers of LFSR 400 contain a zero. Output 412 of decoder 410 detects when the registers contain the last number in the generated sequence, as explained more fully below. Output 411 is input to an OR gate 461 of feedback circuit 460 and OR gate 454 of feedback circuit 450. Output 412 is used to initialize LFSR 400.

Decoder 420 is a 5 of 7 decoder which is connected to decoder 422 through line 421. Line 423 connects decoder 422 and accumulating register 430. Accumulating register 430 is a 32 bit register with output 431, and which receives error status line 343 from RDP 304 (see FIG. 2).

Figure 7:
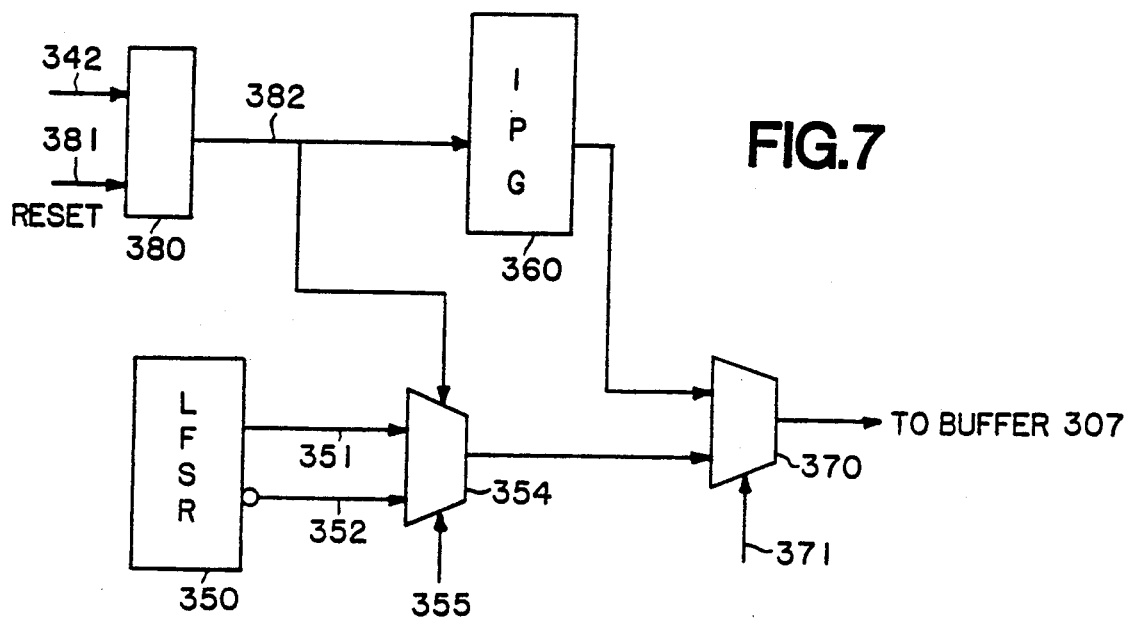
FIG. 7 is a block diagram of a portion of the memory device shown in FIG. 2 in accordance with a second embodiment of the invention.

FIG. 7 is a modified version of the circuit of FIG. 4, corresponding to a second embodiment of the invention and like elements have like reference numbers. The modified circuit includes error status Flip Flop 380 which receives as its input line 342 from RDP 304. The output of Flip Flop 380 is received by IPG 360 and selector 354 through line 382. Flip Flop 380 can be reset by reset line 381. Flip Flop 380 operates such that once set it will remain set until it has been reset by a pulse on line 381.

Figure 8:
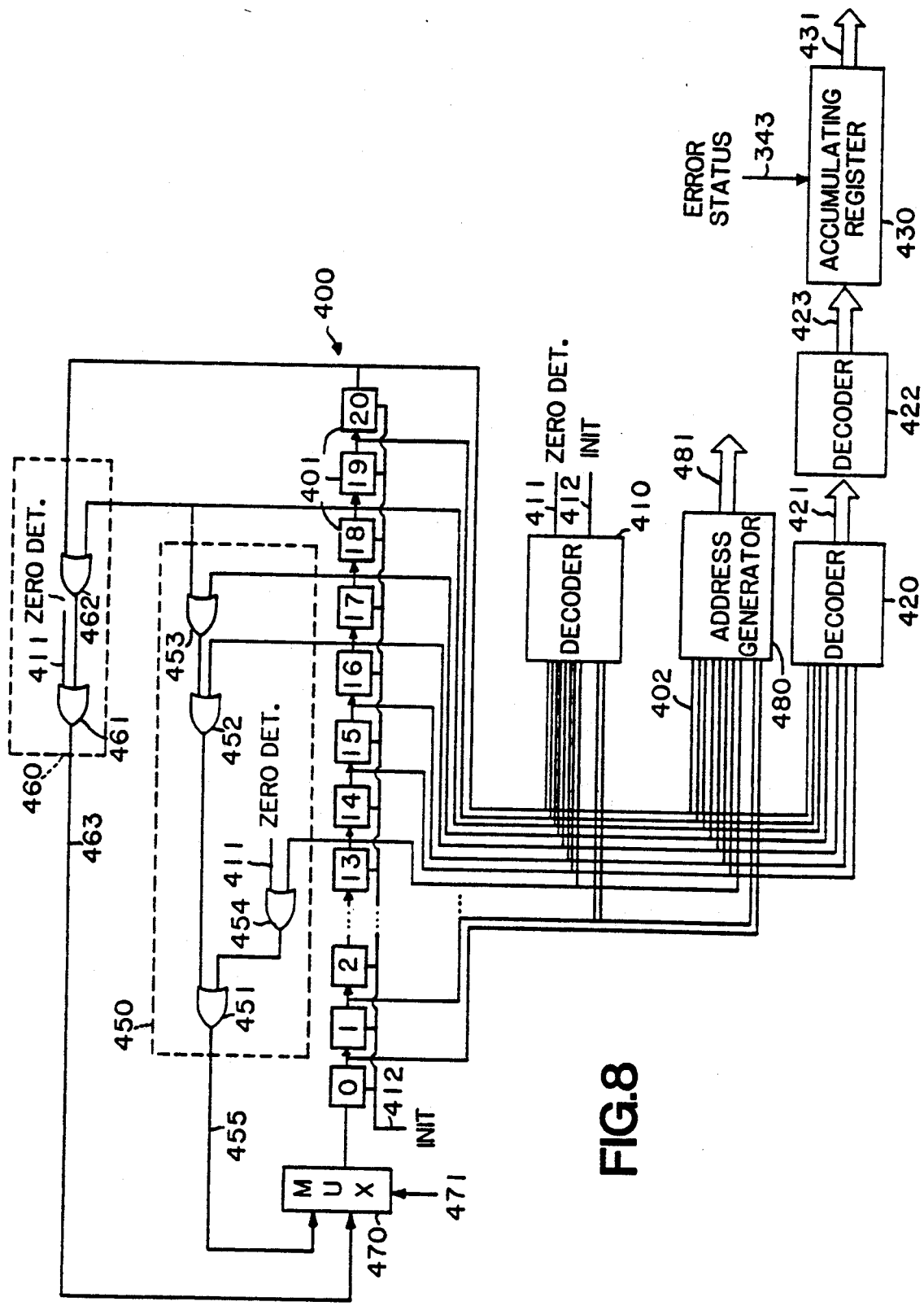
FIG. 8 is a schematic diagram of a control chip shown in FIG. 2 in accordance with a second embodiment of the invention.

FIG. 8 is a modified version of the circuit of FIG. 5, also corresponding to the second embodiment of the invention. Like elements in FIG. 8 also have like reference numbers. The modified circuit includes address generator 480 which receives the outputs of LFSR 400 through line 402. Address generator 480 uses the outputs of LFSR 400 as the upper bits of a plurality of memory addresses and generates the lower bits of each memory address by means of a counter (not shown) or other standard device, and supplies the complete address to address buffers 309 through line 481. The operation of this device is explained more fully below.

OPERATION

Referring to FIG. 1, a high speed computer system implementing the present invention is illustrated and includes four identical memories 30, each of which is connected to MBOX 20 through MMBUS 35. MMBUS 35 is a bidirectional multiplexed address/data bus. MBOX 20 controls the transfer of data between each MMBUS 35 and one of four MBUSES 15. When a CPU 10 requires data from, or wants to write data to, one of memories 30, a request is sent to MBOX 20 via an MBUS 15. MBOX 20 then implements the read or write task to a memory 30 through an MMBUS 35.

Memory 30 is shown in greater detail in FIG. 2 as described above. Memory functions are largely controlled by AMC 308, WDP 306 and RDP 304. AMC 308 contains the memory address path logic as well as the control logic for the memory. The control functions include: DRAM control, including row address strobe, column address strobe, and address and write enable signals; refresh control; MMBUS data/address and handshaking; RDP and WDP chip control, error correction control; block and I/O cycle control; and memory selftest. Only the memory selftest functions are relevant to the present invention.

RDP 304 receives data from DRAMS 302 during normal operations, performs error checking functions, and sends the data to MMBUS 35 for transmission to the requesting CPU 10. WDP 306 receives data from MMBUS 35, performs parity checks and sends the data to DRAMS 302. The functions of RDP 304 and WDP 306 during selftest are explained below.

The selftest feature of the invention will test each memory location in DRAMS 302 by writing data into DRAMS 302, reading the data out and testing the read data to see that it has not been altered in any way. This process of writing data, reading data and testing the read data is performed twice during selftest. During each of these two phases, the data read from each memory location is tested by regenerating the data word that was stored at that location and comparing the read data word to the regenerated data word. If the memory location is operating properly (i.e., if it is a "good" location) the read data word should be equivalent to the regenerated data word. If the data read from a particular memory location is not equivalent to the data that was written into that location, that memory location will be deemed to be malfunctioning and will be registered as a "bad" memory location for eventual repair or replacement.

Since several adjacent memory locations are often bad (e.g., they may be shorted together), it is more likely that bad locations can be located by pseudo-randomly writing pseudo-random data to the memory. During normal operation of the system, variable data is written to memory in a non-sequential way and, therefore, pseudo randomly writing pseudo random data during testing will more closely parallel actual operating conditions and will therefore be more likely to locate errors.

As each data word is read and tested during the first phase, the memory is completely filled with data a second time, with the data used in the second phase being inverse to the data used in the first phase. As in the first phase, the data is read from memory and compared to regenerated data. Of course, during this second phase the regenerated data is inverse data. In this way, each cell of the memory will be tested by writing and reading both a "one" and a "zero". This will make it more likely that bad locations are discovered since a bad cell will frequently output the same bit regardless of what is stored. In other words, if a bad cell always outputs a "one", it will be impossible to detect that this cell is bad by writing and reading a "one" from this location. It is only when the system attempts to store a "zero" that the error will be detected. Using inverse data in the second phase will therefore assure that each location is properly tested.

During the first and second phases, as bad memory locations are detected, the location of the malfunctioning memory is recorded. In order to further insure that bad locations are properly recorded, only those locations found to be functioning properly during the first phase are written with inverse data for the second phase, while those found to be bad during the first phase are again written with the same data word. Therefore, during the second phase, when each data word is read out and compared to the inverse data word, those locations written with non-inverse data will be clearly detected as errors (since the non-inverse data word will be compared to an inverse data word in the second phase). As each data word is tested during the second phase, the memory is "initialized" by writing all zeros into good memory locations and all ones into bad memory locations. Initializing the memory in this way will facilitate locating bad memory locations when diagnostic functions are performed.

The method of the present invention will now be described in detail while referring to the apparatus depicted in the drawings.

Figures 1, 6:
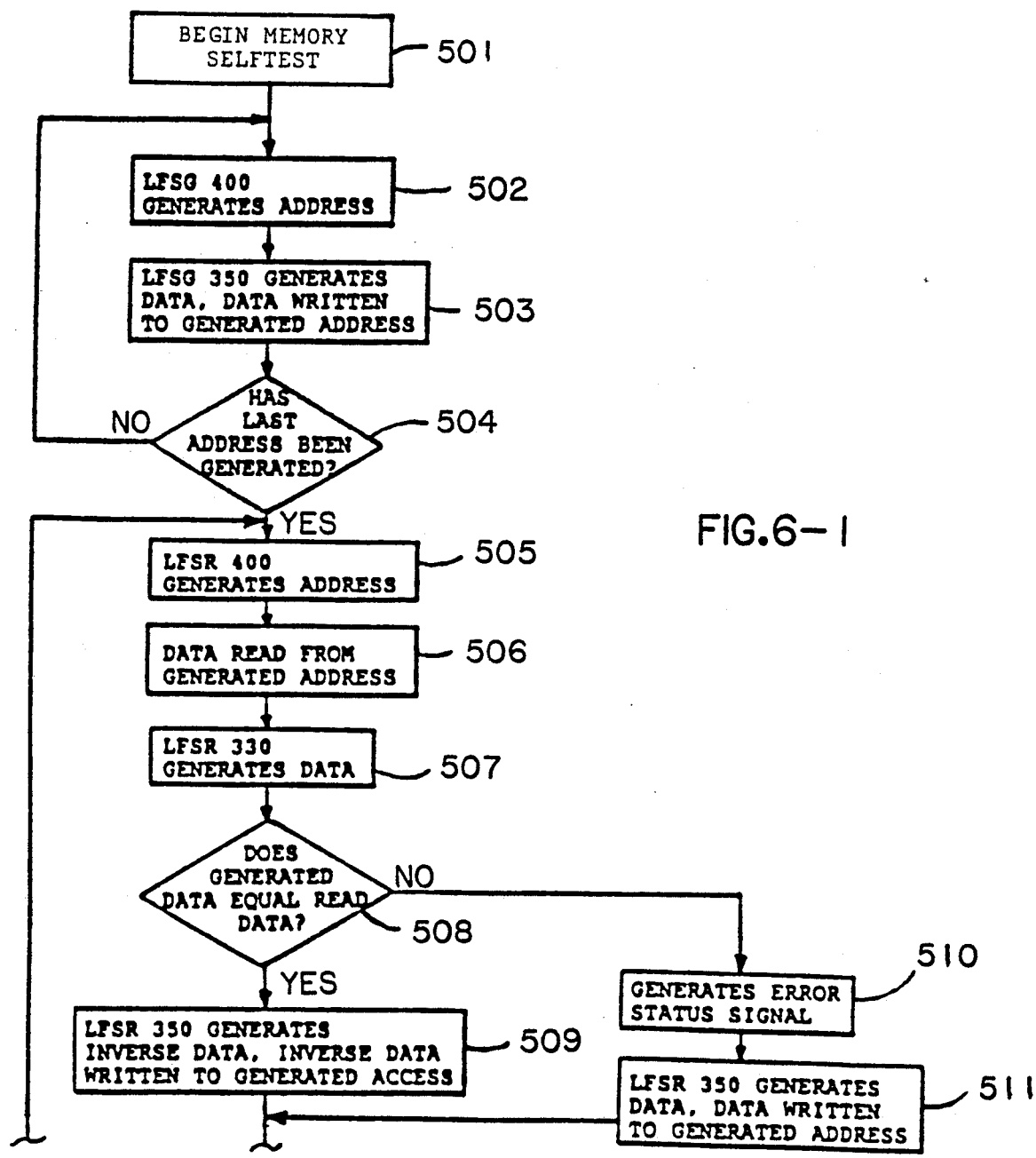
Figures 2, 6:
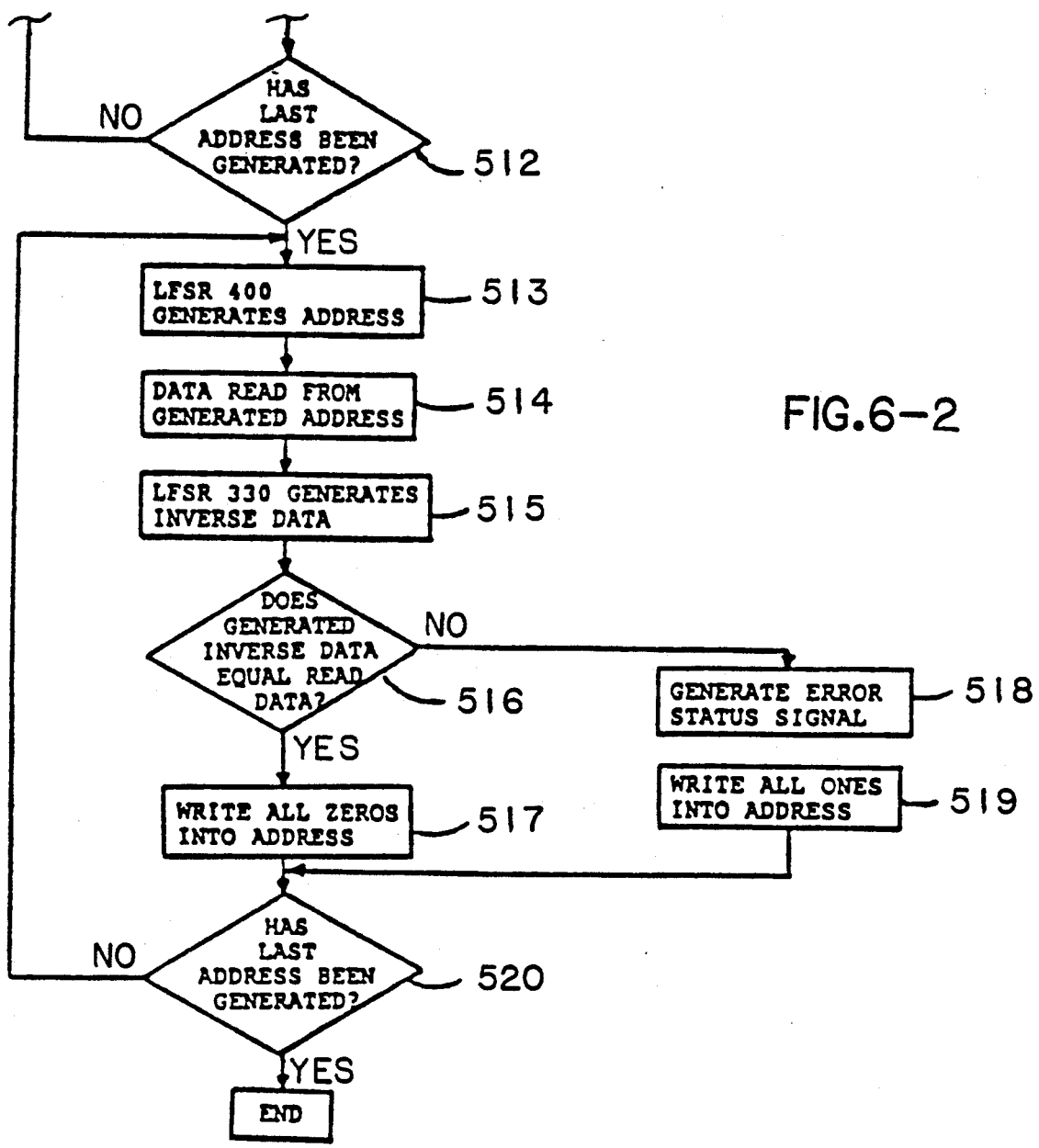

The selftest function is performed when the system first goes on line and can be performed at any desired time. FIG. 6 is a flow chart which illustrates the selftest algorithm of the preferred embodiment.

After memory selftest is begun (step 501 in FIG. 6), the first step is the writing of pseudo-randomly generated data into every memory location of DRAMS 302. As discussed above, the memory locations are accessed in a pseudo-random manner. Referring to FIG. 5, LFSR 400 is used to generate each and every memory address in a pseudo-random manner (Step 502). As is well known, a linear feedback shift register is a shift register with one or more feedback paths that can generate every possible number in a range of numbers depending on the number of stages in the feedback path and the specific feedback network. The feedback network and number of stages are chosen depending on the size of the memory to be tested such that all possible addresses are generated. LFSR 400, unlike a standard LFSR, has two possible feedback networks. Feedback network 450 utilizes the outputs of stages 13, 16, 17 and 18 as well as "zero detect" line 411, described below. Feedback network 460 utilizes the outputs of registers 18 and 20 and zero detect line 411. Since different size memories may be utilized with the system, it is desirable to be able to use an LFSR with various numbers of stages since a different number of addresses will have to be generated for memories of different sizes. LFSR 400 shown in FIG. 5 is designed to be used as either a nineteen stage LFSR (using stages 0-18) or a twenty-one stage LFSR (using stages 0-20). When used as a nineteen stage LFSR, feedback network 450 is used by setting control line 471 of MUX 470 to select line 455 as its output. Similarly, feedback network 460 is used when LFSR 400 is used as a twenty-one stage shift register and output line 463 is chosen as the output of MUX 470.

LFSR 400 also differs from prior art LFSRs in that prior art LFSRs are not capable of generating the number zero. If all stages of a prior art LFSR are set to zero the LFSR will "stall" or get stuck in that state. In order for an LFSR to keep "running" or to keep generating numbers there must be at least one non-zero bit in some stage. Without at least one such bit there will be no feedback and the LFSR will not operate, i.e., it will continually shift and feed back zeros. Consequently, once an LFSR is running it will never generate the number zero. This is undesirable since it means that the address corresponding to zero will never be tested if a standard LFSR is used.

LFSR 400, however, is able to generate a zero address by means of decoder 410. Decoder 410 receives each of the output lines and detects when the last number is generated. For example, when utilizing LFSR 400 as a 20 stage LFSR, the last number in the sequence will be reached when stage 18 is a one and all other stages are zero. Using a simple logic circuit, decoder 410 detects this condition and outputs an initialization pulse (INIT) on line 412 which clears all stages of LFSR 400 (i.e., creates the zero state). LFSR 400 will then output all zeroes enabling the zero address to be accessed. In order to prevent the LFSR from "stalling", decoder 410 will also detect this condition using a simple logic circuit and will output a one on zero detect line 411. Zero detect line 411 is input into both of the feedback networks of LFSR 400 which will introduce a one into the feedback line and prevent LFSR 400 from getting stuck in the zero state.

As addresses are generated by LFSR 400, data words are generated by LFSR 350 (see FIG. 4) and one data word is written to each generated address (Step 503). Referring to FIG. 4, the generated data words are output onto line 351 and selectors 354 and 370 are set (i.e., by control lines 355, 371) such that this data is passed to data buffer 307 (shown in FIG. 2). It is not necessary to have a data word comprising all zeros so LFSR 350 is a standard LFSR and is not the novel LFSR shown in FIG. 5 (i.e., LFSR 400). This process continues until all data addresses have been generated by LFSR 400 and have been written with data generated by LFSR 350 (Step 504).

When DRAMS 302 have been completely written with random data, LFSR 400 again generates all memory address (Step 505). As each address is generated, RDP 304 is utilized to read each data word (Step 506), generate a corresponding data word in LFSR 330 (Step 507), and perform a comparison between the read data word and the generated data word (Step 508). LFSR 330 is identical to LFSR 350 and the data words generated by LFSR 330 will be identical to those generated by LFSR 350 and written into DRAMS 302 during Step 503. During this portion of selftest, selector 334 (see FIG. 3) will select data from line 331 by means of control 335 and will input the data words one at a time into compare circuit 340 where they are compared to the read data words received on line 341. If the memory is operating properly, the two compared words should be equivalent. In other words, since LFSR 330 is identical to LFSR 350, each data word input into compare circuit 350 from LFSR 330 should be equivalent to the data word read from memory. However, if the memory location at which the data word was stored has malfunctioned then the read data word will not be equivalent to the generated data word.

Compare circuit 340 has two outputs, one to WDP 306 (output 342) and one to AMC 308 (output 343). As the comparisons are made, WDP 306 will write data back into the memory location in which the read data word was located WDP 306 will write an inverse data word back into the memory location if the result of the comparison shows that the read data word equals the generated data word (Step 509). If the result of the comparison shows that the read data word is not equivalent to the generated data word (i.e., the "no" result in Step 508), then the memory location being tested has malfunctioned and compare circuit 340 outputs an error status signal to AMC 308 (Step 510), and instructs WDP 306 to write the same data word back into the memory location (Step 511). As discussed above, writing the same data word back into the memory location will ensure that this memory location will generate an error signal during the second comparison phase of selftest, to be described below. As can be seen in FIG. 4, WDP 306 selects either data or inverse data through selector 354 which receives line 342 from comparator 350 of RDP 304. Selector 370 is set to receive data from selector 354 during this stage through control line 371. This process continues until each memory address has been accessed, the comparison performed, and each memory location contains either the inverse data (if the location is "good") or the same data (if the location is "bad") (Step 512). AMC 308 utilizes the error status signals to record the locations of bad portions of memory as described below.

The next phase of selftest will read out the stored data and perform comparisons in basically the same manner as described above. LFSR 400 generates every possible address once again (Step 513). RDP 304 will read the stored data (Step 514) and will generate inverse data words for comparison to the read data words (Step 515). Referring to FIG. 3, LFSR 330 will generate inverse data words at line 332 which will be selected by selector 334 and input to compare circuit 340. If the memory location being acessed was found to be good during the first comparison (Step 508) it should now contain inverse data (Step 509) generated by LFSR 350. Therefore, RDP 304 will compare the read data to the generated inverse data (Step 516) and the generated and read data words should be equal if the memory is functioning properly. The result of the comparison will be negative if either the location was found to be bad during the first comparison and was therefore written with the same data (Step 511) since the same data will not be equal to the inverse data, or if having previously been found to be a good location (and written with inverse data), the read inverse data does not match the generated inverse data (indicating memory error).

If the second comparison is positive, indicating that the memory location has successfully stored the data during both phases of selftest, output 342 of compare circuit 350 (FIG. 3) instructs initialization pattern generator 360 of WDP 306 (FIG. 4) to write all zeroes to that memory location (Step 517). If, however, the comparison is negative, compare circuit 340 generates an error status signal on line 343 (Step 518) and instructs initialization pattern generator 360 to write all ones into the memory location (Step 519). During this portion of selftest, selector 370 is set by control line 371 to write the output of initialization pattern generator 360 to memory. This process continues until all memory locations are tested and written with ones or zeros (Step 520). When selftest is completed and the computer system becomes operational, memory locations containing zeros are good memory locations and memory locations containing ones are bad memory locations.

It should be noted that it may be desirable to utilize "check bits" for stored data. In the preferred embodiment, a plurality of check bits are stored for each memory location in the memory, these bits being utilized by the system to detect errors caused during data read operations (e.g., errors caused by noise). As is well known in the art, a unique code is generated and stored with each data word. Therefore, each memory location is divided into a data section and a check bit section. In order for the memory device to operate properly, only the data section of each memory location should be written with all ones or all zeroes during initialization, with the check bit section storing the normal code associated with the stored data (i.e., the code for a data word comprising all ones or all zeros).

As discussed above, when compare circuit 340 determines that a data word read from memory does not match the corresponding data word generated by LFSR 330, it outputs an error status signal to AMC 308 (Steps 510 and 518), which stores the location of the error. The novel method and apparatus for registering the locations of those portions of memory that are found to be bad will now be described.

Referring again to FIG. 5, the upper 7 bits (i.e., the outputs of stages 14-20), in addition to being supplied to address buffers 309 and decoder 410, as described above, are supplied to decoder 420. Decoder 420 is a 5 of 7 decoder and selects the upper 5 bits as its output depending on whether LFSR 400 is being utilized as a 19 stage or 21 stage LFSR. In other words, if LFSR 400 is being used as a 19 stage LFSR then decoder 420 selects the outputs of stages 14-18 as its output and selects stages 16-20 when LFSR 400 is used as a 21 stage LFSR. Therefore the output of decoder 420 will always be the upper 5 bits of the address of the memory location currently being tested. These 5 bits are output to "5 to 32" decoder 422. Decoder 422 receives the 5 bits and selects one bit of 32 bit accumulating register 430. If the error status line 343 is activated (indicating that the data word currently being compared is bad), accumulating register 430 will then "set" the bit corresponding to the output of decoder 422. If the error status line is not set, the corresponding bit in register 430 will not be set.

Accordingly, accumulating register 430 divides the memory up into 32 blocks or sections, with each section of memory having a representative bit in accumulating register 430. Therefore, when a memory location is found to be bad, the bit in register 430 corresponding to the block of memory that contains the bad memory location will be set. This represents a unique and extremely useful method of storing the approximate locations of bad sections of memory. When the system is serviced, the output of accumulating register 430 is obtained through line 431 and used to perform diagnostic services. It should be noted that by changing the size of accumulating register 430 (and corresponding changes to decoders 420 and 422) the memory can be divided into any number of sections thereby changing the accuracy of the location of errors.

In the embodiment described above, LFSR 400 generates memory addresses which are used to access specific memory locations in DRAMS 302. This system will, therefore, randomly access each memory location within DRAMS 302. In an alternative embodiment, blocks of memory will be pseudo-randomly accessed instead of individual memory locations. The output of LFSR 400 will be used as the upper bits of the addresses of a plurality of memory locations and, as each number is provided by LFSR 400, an address generator will be used to sequentially provide the remaining bits needed to access each of the plurality of memory locations, the address generator providing the bits sequentially.

There are several advantages achieved by accessing blocks of memory pseudo-randomly instead of pseudo-randomly accessing each memory location. When large memories are being tested, a very large LFSR must be utilized for LFSR 400 when each location is to be accessed pseudo-randomly since LFSR 400 must generate the entire address. When LFSR 400 is used only to generate the upper bits of the address a smaller LFSR can be utilized. Furthermore, sequentially accessing memory locations within pseudo-randomly accessed blocks of memory will make it possible to detect errors that may go undetected when each location is pseudo-randomly accessed. Since defective memory locations will sometimes affect nearby locations it is advantageous to access the locations sequentially in blocks to detect such errors.

The apparatus used to implement the alternative embodiment of the invention is largely identical to the apparatus described above with minor modifications to WDP 306 and AMC 308. The modified circuitry is shown in FIGS. 7 and 8, with FIG. 7 corresponding to FIG. 4 and FIG. 8 corresponding to FIG. 5. In order to simplify the description of these circuits, elements which have remained unchanged have been given the same reference numbers.

Figures 1, 9:
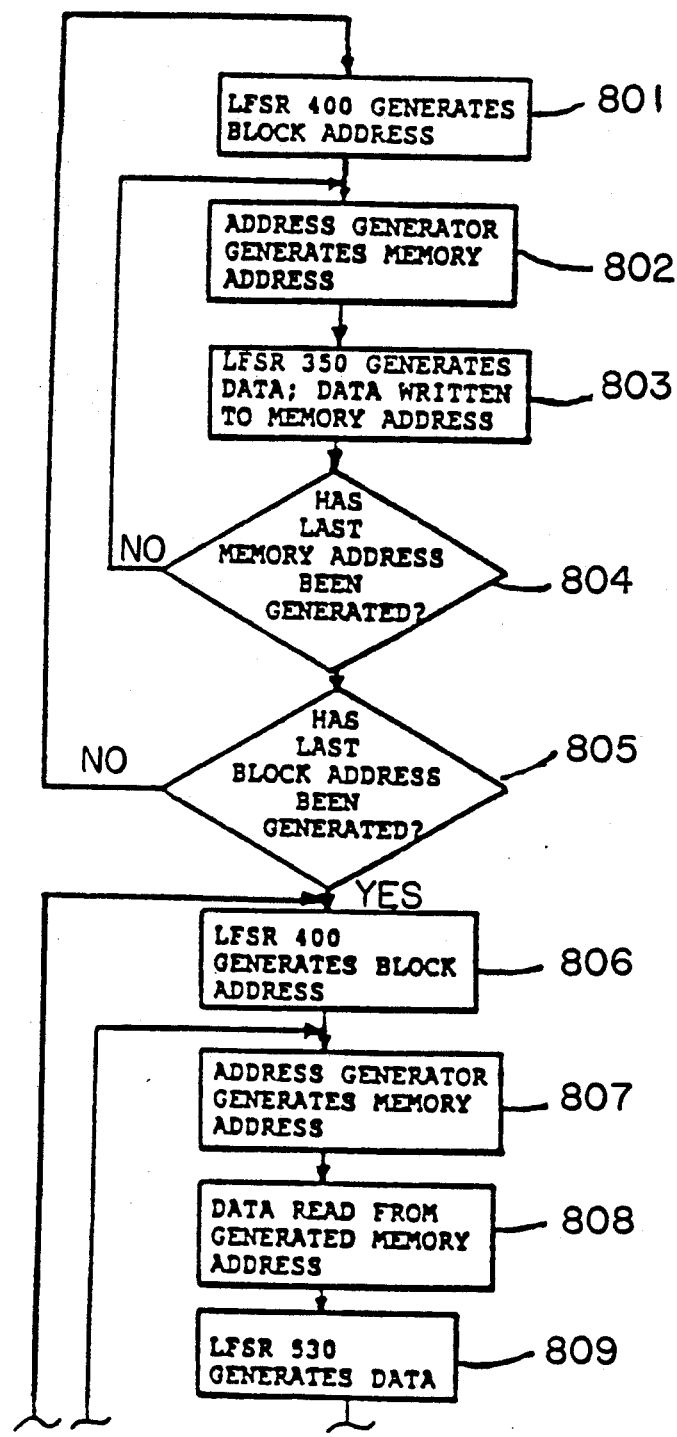
Figures 2, 9:
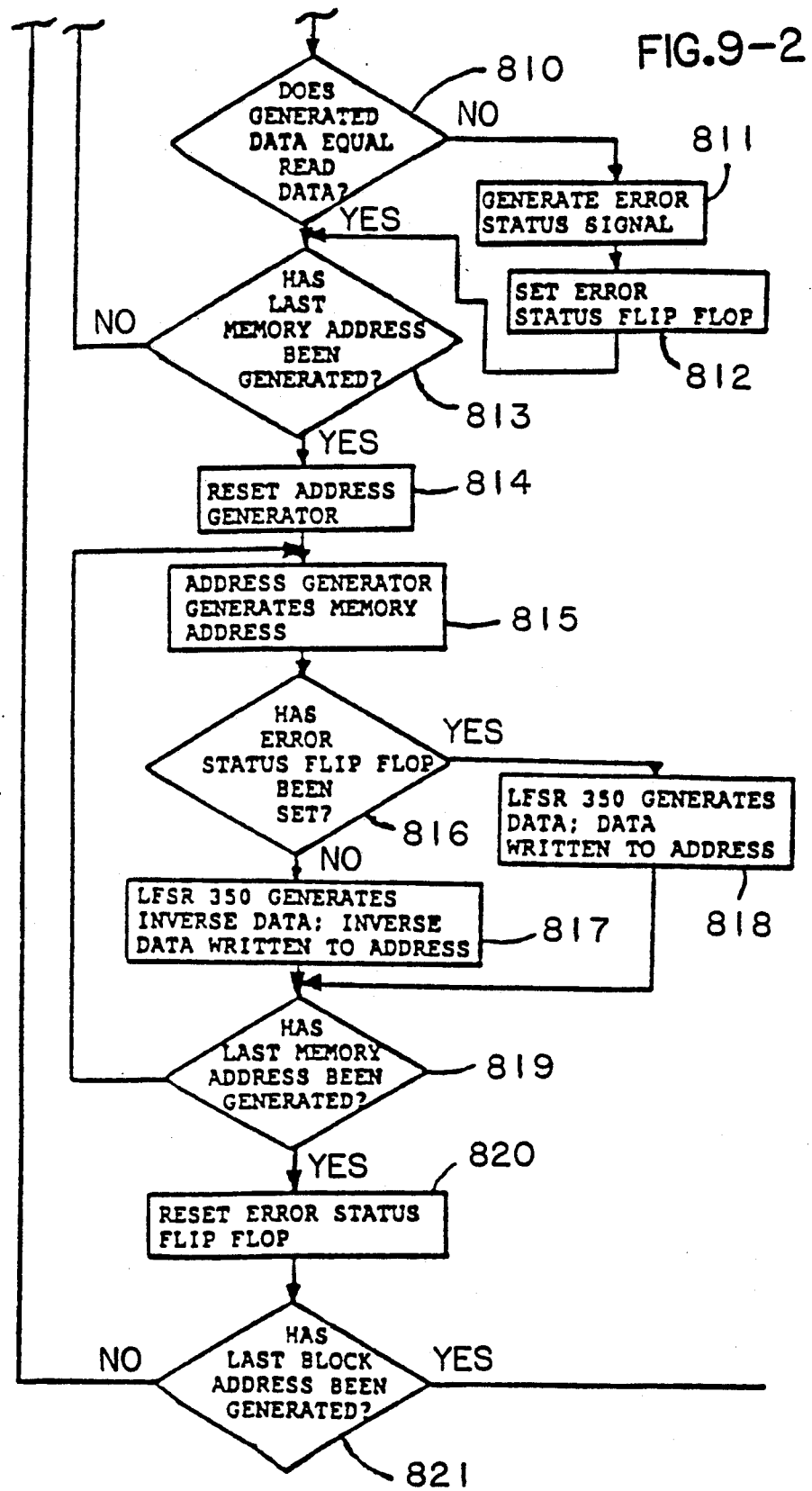
Figures 3, 9:
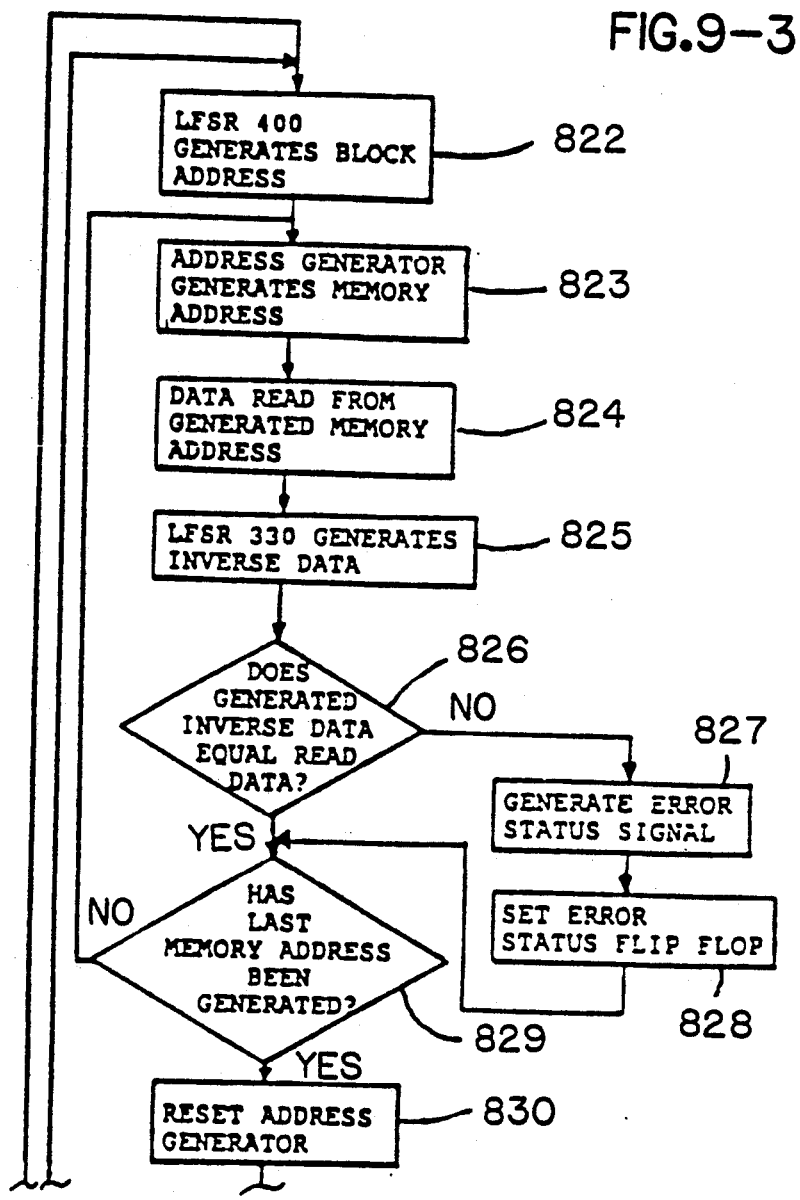
Figures 4, 9:
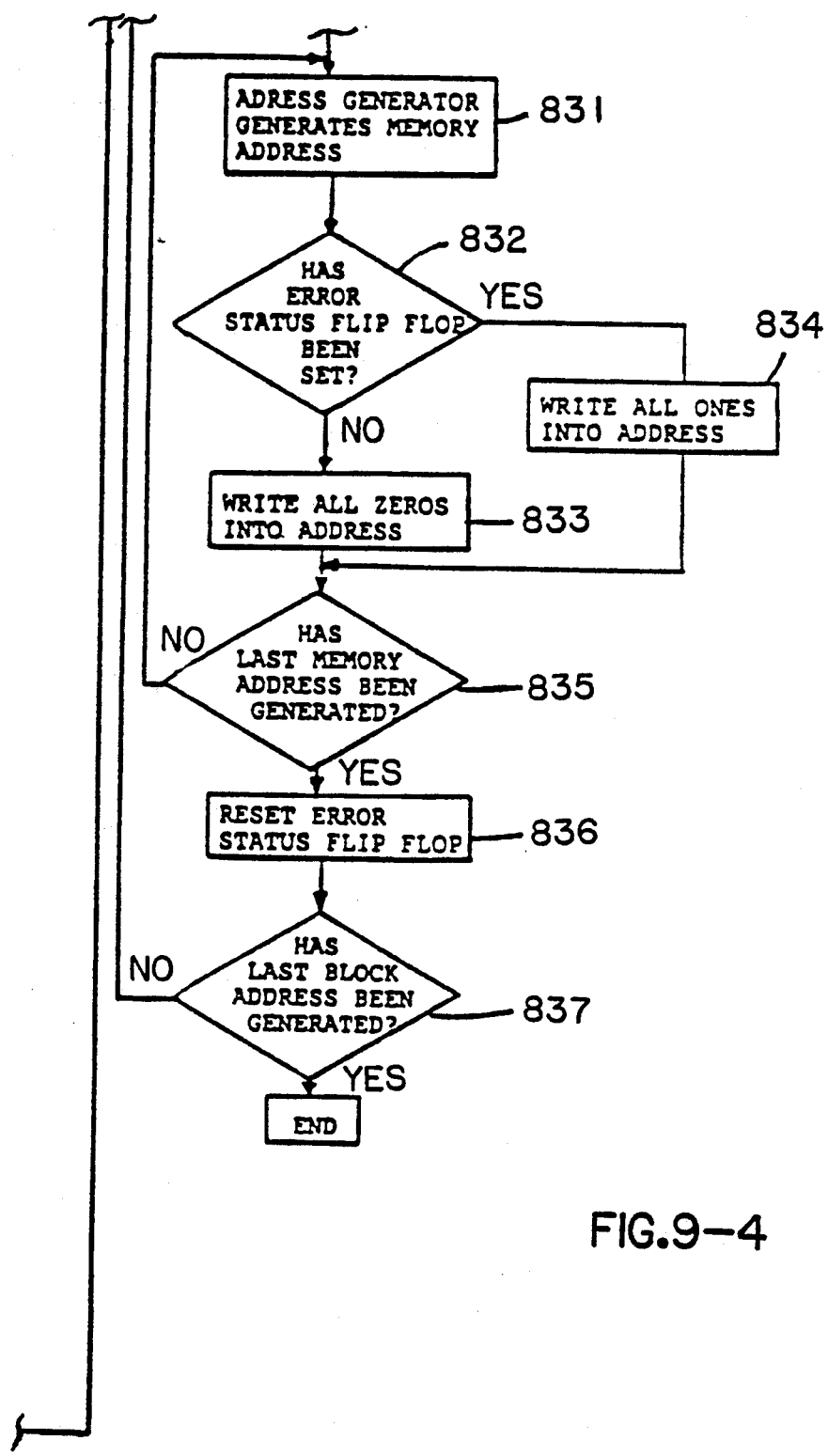

The selftest method of the second embodiment of the invention will now be described in detail with reference to the flowchart of FIG. 9.

The selftest method is substantially the same in the alternative embodiment and generally comprises writing data to each memory location in DRAMS 302, reading the data back from memory and comparing the read data with regenerated data. The data is read from DRAMS 302 a block at a time and each memory location in the block is tested by performing a comparison as in the first embodiment. If each and every data word in the block is found to be equivalent to the regenerated data during this first phase then the entire block of memory is written with inverse data and the next block is accessed. However, if even one data word is found to not be equivalent to the regenerated data, the entire bock is written with the same data thereby ensuring an error signal during the second phase. Similarly during the second phase, if one memory location in a block of memory locations is found to be bad, the entire block is initialized with ones and the block is initialized with zeros only if all locations within the block are found to be good locations.

In the second embodiment, once selftest is begun (Step 800 in FIG. 9), LFSR 400 pseudo-randomly generates the first block address (by generating the upper bits of the memory address) (Step 801). Address generator 480 then adds the lower bits to the bits supplied by LFSR 400 to generate the complete address of the first memory location in the first block (Step 802). As in the first embodiment, LFSR 350 then generates a data word and the data word is written into the generated memory address (Step 803). This process continues until a data word is stored at each memory address within the first block of memory (Step 804). When address generator 480 has generated each of the memroy addresses, LFSR 400 generates the next block address (Step 801) and the process repeats. This continues until all block addresses have been generated (Step 805), and the entire memory has been written with data.

LFSR 400 will next generate the address of the first block once again (Step 806) and address generator 480 will generate the first memory address (Step 807). RDP 304 will next read the data word stored at the generated address (Step 808) and LFSR 330 will regenerate the corresponding data word (Step 809). The generated data word will next be compared to the read data word (Step 810) and the words should be equivalent if the memory is functioning properly. If the result of Step 810 is negative, an error status signal is generated (Step 811) and error status flip flop 380 is set (Step 812). This comparison process will continue until all of the memory locations within the current memory block have been read out and compared to regenerated data (Step 813). It should be apparent that error status flip flop 380 will be set (and remain set) if any of the comparisons performed during a particular block are negative.

When all of the memory locations in the current block have been tested, address generator 480 is reset (Step 814) and again generates the first memory address within the block (Step 815). The status of the error status flip flop is checked (Step 816) and if it has not been set, inverse data generated by LFSR 350 is written into the memory location (Step 817). If, however, the error status flip flop has been set, non-inverse data (i.e., the same data generated in Step 803) is written into the memory location (Step 818). This process continues until each location with the current block has been written with inverse data or non-inverse data (Step 819). Note that, since the result of step 816 will be the same for each location within a given block, every location within the block will either be written with inverse data or non inverse data. If the current block is not the last block (Step 821) LFSR 400 generates the next block address (Step 806) and the process continues. The error status flip flop is reset between blocks (Step 820).

Accordingly, LFSR 400 generats the address of a block and every memory location within that block is first tested by reading out the data and performing a comparison. Once all of the memory locations have been tested, each location is again accessed and written with either inverse data (if all of the memory locations in the block were found to be good) or non inverse data (if any of the locations within the block were found to be bad). Each block of memory is tested in this manner.

The second phase of selftest begins at step 822 where LFSR 400 generates the first block address. The address generator then generates the first memory address (Step 823) and the data stored at that memroy address is read (Step 824) and compared to inverse data generated by LFSR 330 (Steps 825 and 826). If the result of the comparison is negative indjcating an error, the error status signal is generated (Step 827) and the error status flip flop is set (Step 828). This process continues until the entire block of memory has been read out and compared to regenerated inverse data (Step 829). The address generator is then reset (Step 830) and generates the first memory address (Step 831). If the error status flip flop is not set (Step 832) then all zeros are written to the memory location at the current address (Step 833)

and if the error status flip flop is set all ones are written to the memory location (step 834). This continues until all memroy locations within the block have been written with either ones or zeros (Step 835) and ultimately continues until all blocks of memory have been initialized (Step 837) with the error status flip flop being reset between each block (Step 836).

The above-described memory selftest method and apparatus provides an effective and efficient method for testing each and every memory location of a memory device. Once the memory has been initialized with ones and zeros in accordance with the invention, diagnostic functions can easily be performed. Diagnostic software can read the contents of accumulating register 430 to obtain the approximate location of malfunctioning memory locations and can then pinpoint the locations by finding the locations where ones are stored.

Prior art methods cannot achieve the fast and accurate testing of the present invention. Additionally, the invention employs a novel LFSR that is capable of generating the zero address without stalling and employs a novel method of storing approximate locations of bad sections of memory in accumulating register 430.

It should be noted that the above described embodiments are illustrative of the invention only and other embodiments are within the scope of the appended claims.

We claim:

1. A method for testing a memory device, said memory device comprising a plurality of memory locations each having a corresponding memory address, said method comprising the steps of:
    (a) generating each of said memory addresses using a linear feedback shift register, including an address of zero;
    (b) generating a predetermined series of data words;
    (c) storing one of said data words at each memory location corresponding to the memory addresses generated in step (a);
    (d) reading each data word stored in step (c);
    (e) regenerating said predetermined series of data words generated in step (b);
    (f) comparing each data word read in step (d) with a corresponding data word regenerated in step (e);
    (g) generating an error signal for each comparison performed in step (f) if the compared data words are not equivalent; and
    (h) utilizing said error signals generated in step (g) to store a portion of the memory address of each data word read in step (d) that is not equivalent to the corresponding data word generated in step (e).

2. The method of claim 1 wherein said memory addresses are generated in a pseudo-random order.

3. The method of claim 1 wherein said predetermined series of data words is a pseudo-random series.

4. The method of claim 1 wherein step (a) comprises pseudo-randomly generating the addresses of blocks of memory, each of said blocks comprising a plurality of sequential memory addresses.

5. The method of claim 1 wherein said portion of the memory address of each data word is the upper five bits of said memory address.

6. A method for testing a memory device, said memory device comprising a plurality of memory locations each having a corresponding memory address, said method comprising the steps of:
    (a) generating each of said memory addresses in a predetermined order;
    (b) generating a predetermined series of data words;
    (c) storing one of said data words at each memory location corresponding to the memory addresses generated in step (a);
    (d) reading each data word stored in step (c);
    (e) regenerating said predetermined series of data words generated in step (b);
    (f) comparing each data word read in step (d) with a corresponding data word regenerated in step (e);
    (g) generating an error signal for each comparison performed in step (f) if the compared data words are not equivalent; and
    (h) utilizing said error signals generated in step (g) to store a portion of the memory address of each data word read in step (d) that is not equivalent to the corresponding data word generated in step (e), said portion being stored as a single bit in an accumulating register.

7. A method for testing a memory device, said memory device comprising a plurality of memory locations each having a corresponding memory address, said method comprising the steps of:
    (a) generating each of said memory addresses in a predetermined order;
    (b) generating a predetermined series of data words;
    (c) storing one of said data words at each of said memory locations;
    (d) regenerating said predetermined series of data words;
    (e) reading each data word stored in step (c);
    (f) comparing each data word regenerated in step (d) with a corresponding data word read in step (e) and, for each comparison:
        (i) if the compared data words are equivalent, inverting one of the data words and storing the inverted data word in the memory location in which said read data word was located; or
        (ii) if the compared data words are not equivalent, storing one of said compared data words in the memory location in which said read data word was located and generating an error status signal;
    (g) reading each data word stored in memory in step (f);
    (h) generating a second series of data words each of which is the inverse to the corresponding data word in said predetermined series of data words;
    (i) comparing each data word read from memory in step (g) with the corresponding data word generated in step (h); and
    (j) generating an error status signal for each comparison performed in step (i) if the compared data words are not equivalent.

8. The method of claim 7 further comprising the step of storing, for each comparison performed in step (i), a first predetermined pattern in the memory location in which said data word read in step (g) was located, if said compared data words are equivalent.

9. The method of claim 8 further comprising the step of storing, for each comparison performed in step (i), a second predetermined pattern in the memory location in which said data word read in step (g) was located, if said compared data words are not equivalent.

10. The method of claim 7 wherein said predetermined order is pseudo-random.

11. The method of claim 10 wherein said memory addresses are generated by a linear feedback shift register.

12. The method of claim 11 wherein said linear feedback shift register generates an address of zero.

13. The method of claim 7 wherein said predetermined series of data words is a pseudo-random series.

14. The method of claim 7 wherein step (a) comprises pseudo-randomly generating the addresses of blocks of memory, each of said blocks comprising a plurality of sequential memory addresses.

15. The method of claim 7 further comprising the step of:
(k) utilizing the error status signals generated in steps (f) and (j) to store a portion of the memory address of each data word read in steps (e) and (g) that is not equivalent to the data word compared in steps (f) or (i).

16. The method of claim 15 wherein said portion of the memory address of each data word is stored as a single bit in an accumulating register.

17. The method of claim 16 wherein said portion of the memory address of each data word is the upper five bits of said memory address.

18. The method of claim 7 wherein said one of said compared data words stored in step (f) is said regenerated data word.

19. A linear feedback shift register for generating a pseudo-random series of digital numbers, said linear feedback shift register comprising:
a plurality of stages, each stage storing either a zero or a one and each stage having an output determined by its stored digital value;
a feedback path connecting one or more of said outputs to an input of one of said stages;
a decoder for receiving a plurality of said outputs of said stages and determining when each of said received outputs has a first predetermined value or a second predetermined value;
zero generating means for generating a zero in each of said plurality of stages in response to said decoder detecting the existence of said first predetermined value such that each of said outputs is a zero; and
means for generating a one in at least one of said stages in response to said decoder detecting the existence of said second predetermined value.

20. The linear feedback shift register of claim 19 wherein said second predetermined value is zero.

21. A linear feedback shift register for generating a pseudo-random series of digital numbers, said linear feedback shift register comprising:
a plurality of stages, each stage storing either a zero or a one and each stage having an output determined by its stored digital value;
first and second feedback paths and connection means for connecting either said first feedback path or said second feedback path to one of said stages,
a decoder for receiving a plurality of said outputs of said stages and determining when each of said received outputs has a predetermined value; and
zero generating means for generating a zero in each of said plurality of stages in response to said decoder detecting the existence of said predetermined value such that each of said outputs is a zero.

22. The linear feedback shift register of claim 21 wherein said predetermined value is the last number in said predetermined pseudo-random series of numbers.

23. In a computer storage system having a memory device comprising a plurality of sections, each of said sections comprising a plurality of memory storage locations, a device for indicating which of said sections of memory has a malfunctioning memory storage location, said device comprising:
testing means for testing each of said memory storage locations to determine which of said memory storage locations are malfunctioning,
a decoder for receiving the memory address of each memory storage location determined to be malfunctioning by said testing means and, for each received address, outputting a signal indicating which of said plurality of sections contains the memory storage location corresponding to said received address; and
a storage device for storing the outputs of said decoder.

24. The computer storage system of claim 23 wherein said storage device comprises an accumulating register.

25. The computer storage device of claim 24 wherein said accumulating register has one bit corresponding to each of said sections, the value of each of said bits indicating whether said corresponding section contains a malfunctioning memory storage location.

26. The computer storage device of claim 23 wherein said decoder selects the upper five bits of each of said received addresses.

* * * * *